United States Patent [19]

Hayakawa et al.

[11] Patent Number: 4,907,239
[45] Date of Patent: *Mar. 6, 1990

[54] SEMICONDUCTOR LASER DEVICE

[75] Inventors: Toshiro Hayakawa, Nara; Takahiro Suyama, Tenri; Kosei Takahashi, Tenri; Masafumi Kondo, Tenri, all of Japan

[73] Assignee: Sharp Kabushiki Kaisha, Osaka, Japan

[*] Notice: The portion of the term of this patent subsequent to Jul. 25, 2006 has been disclaimed.

[21] Appl. No.: 348,807

[22] Filed: May 8, 1989

Related U.S. Application Data

[63] Continuation of Ser. No. 132,300, Dec. 15, 1987.

[30] Foreign Application Priority Data

Dec. 15, 1986 [JP] Japan ................... 61-298174

[51] Int. Cl.⁴ ............................... H01S 3/19
[52] U.S. Cl. ...................... 372/46; 357/17; 372/45; 372/48
[58] Field of Search ............... 372/46, 45, 48; 357/17

[56] References Cited

U.S. PATENT DOCUMENTS

| | | | |
|---|---|---|---|
| 4,366,569 | 12/1982 | Hirao et al. | 372/46 |
| 4,416,012 | 11/1983 | Botez et al. | 372/45 |
| 4,480,331 | 10/1984 | Thompson | 372/45 |
| 4,512,022 | 4/1985 | Tsang | 372/45 |
| 4,573,161 | 2/1986 | Sakai et al. | 372/45 |
| 4,631,802 | 12/1986 | Hayashi et al. | 372/45 |
| 4,635,268 | 1/1987 | Motegi et al. | 372/45 |
| 4,745,612 | 5/1988 | Hayakawa et al. | 372/45 |
| 4,750,183 | 6/1988 | Takahashi et al. | 372/45 |
| 4,757,510 | 6/1988 | Kaheno et al. | 372/45 |

FOREIGN PATENT DOCUMENTS

| | | |
|---|---|---|
| 0044571 | 1/1982 | European Pat. Off. . |
| 0125738 | 11/1984 | European Pat. Off. . |
| 0206496 | 12/1986 | European Pat. Off. . |
| 0210616 | 2/1987 | European Pat. Off. . |
| 0215298 | 3/1987 | European Pat. Off. . |
| 0048976 | 3/1984 | Japan .................. 372/46 |
| 0207090 | 9/1986 | Japan .................. 372/46 |
| 1378128 | 12/1974 | United Kingdom . |
| 2100501 | 12/1982 | United Kingdom . |

OTHER PUBLICATIONS

Smith, Jul./Aug. 1986, Xerox Disclosure Journal, 11(4), pp. 151-152.
Hayakawa et al., (1986), Applied Physics Letters, 49(11), pp. 636-638.
Kurobe et al., (1986), Electronics Letters, 22(21), pp. 1117-1118.
Patent Abstract of Japan 9 (302), E 362,2025, Application No. 58-250138, 29, Nov. 1985.
Patent Abstract of Japan 8 (139), E-253,1576, Application No. 57-160654, 28 Jun. 1984.
Patent Abstract of Japan 8 (256), E-280,1693, Application No. 59-127893, 22 Nov. 1984.

Primary Examiner—William L. Sikes
Assistant Examiner—Georgia Y. Epps
Attorney, Agent, or Firm—Irell & Manella

[57] ABSTRACT

A semiconductor laser device comprising a substrate of a first conductivity type having a mesa; a first semiconductor layer of a second conductivity type which is formed on the upper surface of the substrate other than the mesa to form a flat plane including the top face of the mesa; a laser oscillation region which is formed on the flat plane and includes an active area for laser oscillation; and a multi-layer structure burying the laser oscillation region, the multi-layer structure comprising a high resistance layer formed on the first semiconductor layer and burying both sides of the laser oscillation region, and a second semiconductor layer of the first conductivity type formed on the high resistance layer.

6 Claims, 3 Drawing Sheets

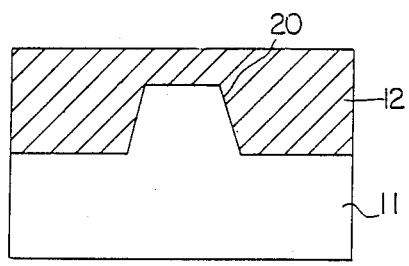
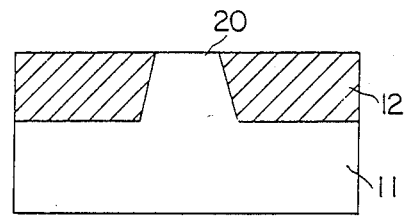
FIG. IA  FIG. IB
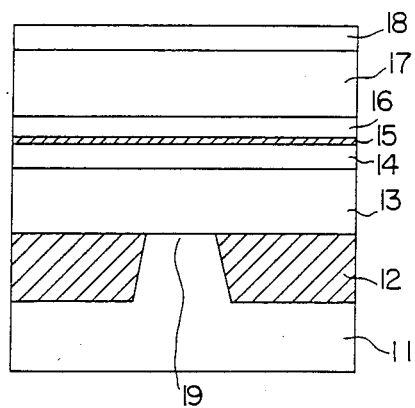
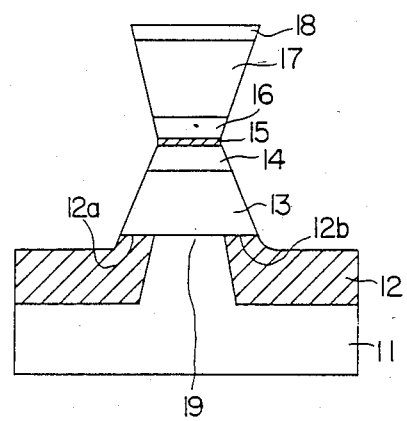
FIG. IC  FIG. ID

SEMICONDUCTOR LASER DEVICE

This application is a continuation of application Ser. No. 132,300 filed Dec. 15, 1987.

BACKGROUND OF THE INVENTION

1. Field of the invention

This invention relates to a semiconductor laser device which has an extremely low threshold current level and can be readily produced by molecular beam epitaxy or metal organic-chemical vapor deposition.

2. Description of the prior art

In recent years, single thin crystal film growth techniques such as molecular beam epitaxy (MBE) and metal organic-chemical vapor deposition (MOCVD) have been rapidly advanced. By these growth techniques, it is possible to obtain epitaxial growth layers of extreme thinness, on the order of 10 Å. Due to the progress in these crystal growth techniques, it is possible to make laser devices based on device structures having very thin layers, which could not be easily manufactured by conventional liquid phase epitaxy. A typical example of these laser devices is the quantum well (QW) laser which has an extremely low threshold current level and in which the active layer has a thickness of 100 Å or less, resulting in the formation of quantum levels therein. Particularly, a single quantum well laser device of a GRIN-SCH (Graded Index-Separate Confinement Heterostructure) type has a very low threshold current level, for example, 350 A/cm$^2$ (cavity length: 250 μm) and 200 A/cm$^2$ (cavity length: 500 μm). This has been reported by W. T. Tsang, Applied Physics Letters, vol. 40, 1981, p. 217.

Further, in order to operate a semiconductor laser device at a low current level, the injected current must be confined in the laser oscillation region. Known examples of semiconductor laser devices showing such a current confining function are a VSIS (V-channeled Substrate Inner Stripe) laser device and a BH (Buried Heterostructure) laser device.

FIG. 4 shows a cross sectional view of a conventional VSIS laser device. Referring to FIG. 4, the structure of the VSIS laser device and the method of producing the device will be described.

On the surface of a semiconductor substrate 1, a current blocking layer 6 is formed. A V-channel which reaches to the substrate 1 is formed in the current blocking layer 6 by an etching technique to form a narrow current path. Then, on the current blocking layer 6 including the V-channel, a cladding layer 2, an active layer 3, a cladding layer 4 and a cap layer 5 are successively formed by a liquid phase epitaxy (LPE), which shows very excellent characteristics of covering a surface having a step(s). As a result of forming the V-channel, the current path is made narrow so that the unstable oscillation mode is eliminated and the device oscillates in the fundamental traverse mode. The VSIS laser device in which the flat active layer 3 is sandwiched by the cladding layers 2 and 4 to form a double heterojunction has a threshold current of 40 mA or less when the width w of the V-channel is 4 μm.

Various kinds of index-guided semiconductor laser devices of this type have been widely developed using an LPE technique. Such a laser device is produced by forming crystalline layers on a substrate having a channel or mesa. Therefore, it is usually difficult to produce such a laser device by MBE or MOCVD. A laser device of this kind has a defect that the active region having a quantum well structure cannot be formed, thereby inhibiting the operation of the laser device at a low current level.

FIG. 5 shows a cross sectional view of a BH laser device. Referring to FIG. 5, the structure of the BH laser device and the method of producing the device will be described.

On the semiconductor substrate 1 of a first conductivity type, a lower cladding layer 2 of the first conductivity type, an active layer 3 and a upper cladding layer 4 of a second conductivity type are successively formed by MBE or MOCVD. Then, the wafer is etched to form a mesa-shaped double heterojunction laser oscillation region including the cladding layers 2 and 4 and active layer 3. A first burying layer 8 of a second conductivity type and a second burying layer of a first conductivity type are successively formed on the surface of the substrate 1 to bury the oscillation region. Then, a cap layer 5 is formed. The refractive indexes of the burying layers 8 and 9 are selected to be smaller than the effective refractive index of the laser oscillation region so that the laser light can be sufficiently confined in the mesa-shaped oscillation region.

As the burying layers 8 and 9 are reversely biased during the operation of the laser device, the injected current cannot pass the burying layers 8 and 9 and are confined in the laser oscillation region, resulting in the formation of a narrow current path. In this index-guided BH laser device, the current and light are confined within the oscillation region by the burying layers 8 and 9, thereby achieving a laser device with a low operating current. A semiconductor laser device of this type having a stripe width (a width of a mesa region) w of 2 μm or less can achieve a low threshold current level of 10 mA or less.

The threshold current level of the BH laser device may be lowered further by replacing the active region with one having a quantum well structure and decreasing the width w. However, unless, the height of the interface (p-n junction) of the first and second burying layers 8 and 9 coincides with that of the interface between the active layer 3 and the second cladding layer 4, as shown in FIG. 4, it is very difficult to lower the threshold current level to about 1 mA because of the following reason. When the height of the interface between the first and second burying layers 8 and 9 fails to coincide with that of the interface between the active layer 3 and the second cladding layer 4, paths of ineffective current which do not contribute to the laser oscillation are formed as shown by the arrow s in FIGS. 6A and 6B. This ineffective current, which amounts generally to about 1 to 5 mA, is larger than the current necessary for laser oscillation, causing the main factor of inhibiting the production of a semiconductor laser of a low threshold current level.

Even if the height of the interface between the first and second burying layers 8 and 9 coincides with that of the interface between the active layer 3 and the second layer 4, it is impossible to suppress the amount of the ineffective current flowing from the active layer 3 to the burying layer 8 or 9 to an extremely low level of about 1 mA or less.

As seen from the above, in conventional VSIS semiconductor laser devices, it is very difficult to form an active area of a quantum well structure by MBE or MOCVD. In conventional BH semiconductor laser devices, it is possible to form an active area of a quantum well structure by MBE or MOCVD, but it is very difficult to coincide the height of the interface of the active area with that of the p-n junction formed by the burying layers. Even if the heights are coincided with each other, it is very difficult to prevent the leakage of the injected current from the active area to one of the burying layers. In any case, it is difficult to produce a semiconductor laser device of a low threshold current level by a conventional technique.

SUMMARY OF THE INVENTION

The semiconductor laser device of this invention, which overcomes the above-discussed and numerous other disadvantages and deficiencies of the prior art, comprises a substrate of a first conductivity type having a mesa, a first semiconductor layer of a second conductivity type which is formed on the upper surface of said substrate other than said mesa to form a flat plane including the top face of said mesa, a laser oscillation region which is formed on said flat plane and includes an active area for laser oscillation and a multi-layer structure burying said laser oscillation region, said multi-layer structure comprising a high resistance layer formed on said first semiconductor layer and burying both sides of said laser oscillation region, and a second semiconductor layer of the first conductivity type formed on said high resistance layer.

In a preferred embodiment, the active area comprises quantum well layers.

In a preferred embodiment, the width of said active area is substantially the same as the width of said mesa.

In a preferred embodiment, the laser oscillation area is formed as a mesa shape.

In a preferred embodiment, the laser oscillation area is formed as a reversed mesa shape.

In a preferred embodiment, the laser oscillation region is formed as a mesa shape in which the width of the middle portion is smaller than the widths of the top and bottom portion.

Thus, the invention described herein makes possible the objectives of (1) providing a semiconductor laser device which can prevent the ineffective current from flowing through the device, resulting in an extremely low operation current level of the device; (2) providing a semiconductor laser device having an active area of quantum well structure which can be produced by MBE or MOCVD; and (3) providing a semiconductor laser device which can be readily produced in high yield.

BRIEF DESCRIPTION OF THE DRAWINGS

This invention may be better understood and its numerous objects and advantages will become apparent to those skilled in the art by reference to the accompanying drawings as follows:

FIGS. 1A to 1D are cross sectional views showing diagrammatically one example of the present device at each of the production steps.

DESCRIPTION OF THE PREFERRED EMBODIMENTS

According to the invention, the semiconductor laser device comprises the substrate of the first conductivity type having the mesa and the first semiconductor layer of the second conductivity type burying the steps of the substrate formed by the mesa, and the top face of the mesa and the surface of the first semiconductor layer form a flat plane, thereby enabling the formation of the laser oscillation region on the flat plane by MBE or MOCVD.

The laser oscillation region is buried by the high resistance layer, and the second semiconductor layer of the first conductivity type is formed on the high resistance layer. The first semiconductor layer, the high resistance layer and the second semiconductor layer are reversely biased during the operation of the laser device, and, therefore, the injected current is confined into the laser oscillation region. Further, the laser oscillation region is buried by the high resistance layer, thereby preventing the ineffective current from flowing into the burying structure.

Example

Figure 2:
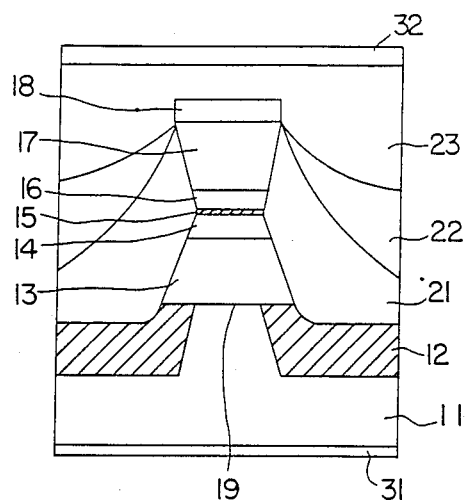
FIG. 2 is a diagrammatic cross sectional view of the example.

FIGS. 1A to 1D show the steps of producing one example of the semiconductor laser device of the invention, and FIG. 2 shows a cross sectional view of the device. Referring to FIGS. 1A to 1D and 2, the production process and structure of the example will be described.

The surface of a p-GaAs substrate 11 is etched to form a stripe mesa 20 having a width of 1 $\mu$m and a height of 2 $\mu$m. On the substrate 11, an n-GaAS current blocking layer 12 (Te=$2 \times 10^{18} cm^{-3}$) is grown so that the mesa 20 is buried (FIG. 1A).

The upper portion of the current blocking layer 12 is etched away to expose the top of the mesa 20, thereby forming a flat plane which is composed of the top portion 19 of the mesa 20 and the surface of the current blocking layer 12, as shown in FIG. 1B.

As C, p-$Al_{0.7}Ga_{0.3}As$ cladding layer 13 (Be=$1 \times 10^{18} cm^{-3}$; the thickness thereof being 1 $\mu$m), an undoped $Al_xGa_{1-x}As$ GRIN layer (optical guiding layer) 14 (the thickness thereof being 0.2 $\mu$m), an undoped GaAs quantum well layer (active area) 15 (the thickness thereof being 70 Å), an undoped $Al_xGa_{1-x}As$ GRIN layer (optical guiding layer) 16 (the thickness thereof being 0.2 $\mu$m), an n-$Al_{0.7}Ga_{0.3}As$ cladding layer 17 (Si=$1 \times 10^{18} cm^{-3}$; the thickness thereof being 1 $\mu$m), and an n-$Al_{0.05}Ga_{0.95}As$ cap layer 18 (Si=$1 \times 10^{cm-3}$; the thickness thereof being 0.05 $\mu$m) are successively grown by MBE. In this example, the AlAs mole fraction x of the GRIN layers 14 and 16 is parabolically changed in the range of 0.2 to 0.7. Namely, the AlAs mole fraction of the GRIN layers 14 and 16 increase parabolically with distance from the quantum well layer 15.

Then, the wafer is subjected to an etching treatment to form a stripe mesa-shaped laser oscillation region including layers 13 to 18 (FIG. 1D). By suitably selecting the etchant and employing one of conventional etching techniques, the laser oscillation region can be shaped so that the cross section of the portion lower than the active area 15 has a shape of a normal mesa and that of the portion higher than the active area 15 has a shape of a reversed mesa, as shown in FIG. 1D. The base of the mesa includes the top portion 19 and the portions 12a and 12b of the current blocking layer 12 which are positioned on both sides of the top portion 19. In other words, the cladding layer 13 in the mesa-shaped laser oscillation region is formed on the top portion 19 sandwiched by the portions 12a and 12b. In the example, the width of the quantum well layer 15 can be as narrow as about 1 μm because the lower portion of the mesa-shaped laser oscillation region is formed as a normal stripe mesa.

Thereafter, an undoped $Al_{0.8}Ga_{0.2}As$ burying layer 21 (0.1Ω.cm or more), a p-$Al_{0.8}Ga_{0.2}As$ burying layer 22 (mg=1×10$^{18}$cm$^{-3}$), and a n-GaAs cap layer 23 (Te=1×10$^{18}$cm$^{-3}$) are successively grown by LPE so as to bury the mesa-shaped laser oscillation region. Both sides of the quantum well layer (active area) 15 are fully buried by the high resistance layer 21. Then, Au-Zn and Au-Ge/Ni are deposited on the back face of the n-GaAs substrate 11 and the upper face of the cap layer 23, respectively, and an alloy treatment is conducted to form ohmic p-sided and n-sided electrodes 31 and 32, resulting in a semiconductor laser device.

The burying layer 21 which has a high AlAs mole fraction and acts as a high resistance layer can be readily formed by LPE. On the p-substrate 11, the n-current blocking layer 12, the high resistance layer 21 and the p-burying layer 22 are formed in this sequence. When the laser device is forwardly biased to be operated, this pin layer structure is reversely biased. Therefore, the current injected into the laser device cannot flow through the pin layer structure, that is, the current flows only through the laser oscillation region, resulting in a narrow current path. Further, as the laser oscillation region is buried by the high resistance layer 21, the current does not leak out from the laser oscillation region (i.e., no ineffective current flows).

The semiconductor laser device thus produced and having a cavity length of 250 μm oscillates a laser beam of 840-nm wavelength at a threshold current of 1.5 mA.

Figure 3:
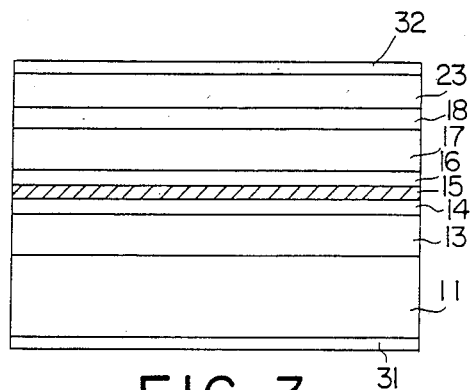
FIG. 3 is a cross sectional view of a GRINSCH semiconductor laser device.
Figure 4:
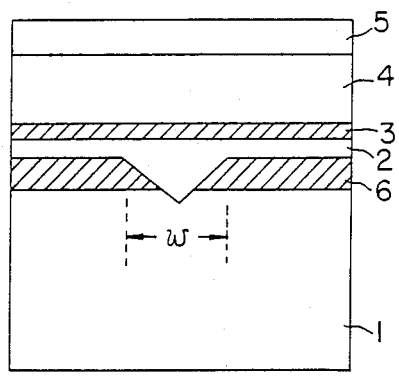
FIG. 4 is a cross section view of a conventional VSIS semiconductor laser device.
Figure 5:
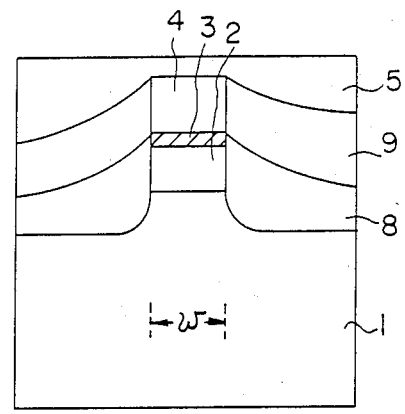
FIG. 5 is a cross sectional view of a conventional BH semiconductor laser device.
Figure 6A:
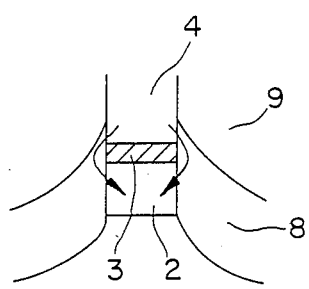
FIGS. 6A and 6B are diagrams illustrating the current flows of the device shown in FIG. 5.
Figure 6B:
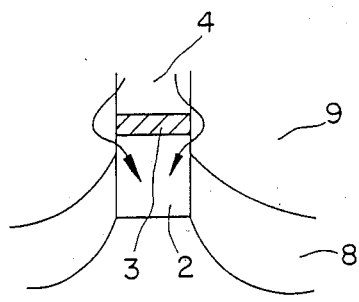

FIG. 3 shows a cross sectional view of a GRIN-SCH semiconductor laser device. The device has a structure the same as that of the above-mentioned example except that the current blocking layer is not formed and the laser oscillation region is not shaped into a mesa. The threshold current density of this GRIN-SCH laser device having a cavity length of 250 μm is 360 A/cm$^2$. The ineffective current of the example having the cavity width of 1.0 μm can be calculated as follows:

$$1.5 mA - (360 A/cm^2 \times 1 \mu m \times 250 \mu m) = 0.6 mA$$

As seen from the above, the threshold current of the example is suppressed to a very low level, i.e., less than 1 mA.

In the above-described example, the laser oscillation is formed on the p-GaAs substrate. Instead of the p-GaAs substrate, a n-GaAs substrate can be used. In this case, the conductivity type of each layer should be change adequately. The shape of the laser oscillation region is not limited to that shown in FIG. 1D, but can be suitably modified. Further, the material to be used in the invention is no limited to AlGaAs, but InAlGaP, InGaAsP or the like can be used in the invention. The growth of layers on the substrate can be conducted by a combination adequately selected from LPE, MBE, MOCVD and VPE (Vapor Phase Epitaxy).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device, the combination of:
    a substrate of a first conductivity type having a mesa;
    a first semiconductor layer of a second conductivity type which is formed on the upper surface of said substrate other than said mesa to form a flat plane including the top face of said mesa;
    a laser oscillation structure comprising a first cladding layer, an active layer for laser oscillation, and a second cladding layer, which is formed on said flat plane, wherein said active layer for laser oscillation is between said first and second cladding layers and above said mesa; and
    a multi-layer structure burying said laser oscillation structure, said multi-layer structure comprising a high resistance layer formed on said first semiconductor layer and burying both sides of said laser oscillation structure, and a second semiconductor layer of the first conductivity type formed on said high resistance layer.

2. A semiconductor laser device according to claim 1, wherein said active layer comprises quantum well layers.

3. A semiconductor laser device according to claim 1, wherein the width of said active layer is substantially the same as the width of said mesa.

4. A semiconductor laser device according to claim 1, wherein said laser oscillation structure is formed as a mesa shape.

5. A semiconductor laser device according to claim 1, wherein said laser oscillation structure is formed as a reversed mesa shape.

6. A semiconductor laser device according to claim 1, wherein said laser oscillation structure is formed as a mesa shape in which the width of the middle portion is smaller than the widths of the top and bottom portion.

* * * * *